United States Patent
Kimura et al.

(10) Patent No.: US 7,407,859 B2
(45) Date of Patent: Aug. 5, 2008

(54) COMPOUND SEMICONDUCTOR DEVICE AND ITS MANUFACTURE

(75) Inventors: Tokuharu Kimura, Kawasaki (JP); Toshihide Kikkawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 116 days.

(21) Appl. No.: 11/541,571

(22) Filed: Oct. 3, 2006

(65) Prior Publication Data

US 2007/0026552 A1 Feb. 1, 2007

Related U.S. Application Data

(62) Division of application No. 10/764,486, filed on Jan. 27, 2004, now Pat. No. 7,132,699.

(30) Foreign Application Priority Data

Jan. 27, 2003 (JP) ............... 2003-017308

(51) Int. Cl.
*H01L 21/339* (2006.01)
*H01L 21/336* (2006.01)
*H01L 21/3205* (2006.01)
*H01L 21/28* (2006.01)

(52) U.S. Cl. .......... 438/285; 438/22; 438/167; 438/592; 438/602; 257/192; 257/193; 257/194; 257/195; 257/200; 257/E21.047

(58) Field of Classification Search ........... 438/22, 438/167, 285, 592, 602; 257/192, 193, 194, 257/195, 200, E21.407
See application file for complete search history.

(56) References Cited

U.S. PATENT DOCUMENTS 6,316,793 B1  11/2001  Sheppard et al. ........... 257/103
6,399,493 B1   6/2002  Dawson et al. ............. 438/682
6,492,669 B2  12/2002  Nakayama et al. .......... 257/282
6,528,405 B1   3/2003  Martinez et al. ........... 438/602
6,639,255 B2  10/2003  Inoue et al. ................ 257/194

(Continued)

FOREIGN PATENT DOCUMENTS

JP    11-016852    1/1999

(Continued)

OTHER PUBLICATIONS

Japanese Office Action dated Nov. 6, 2007 with English translation.

*Primary Examiner*—Michael S. Lebentritt
*Assistant Examiner*—Mohsen Ahmadi
(74) *Attorney, Agent, or Firm*—Kratz, Quintos & Hanson, LLP

(57) ABSTRACT

A compound semiconductor device has: a substrate; a GaN channel layer; an n-type $Al_qGa_{1-q}N$ ($0<q(1)$ electron supply layer; an n-type GaN cap layer; a gate electrode disposed on the cap layer and forming a Schottky contact; recesses formed on both sides of the gate electrode on source and drain sides by at least partially removing the cap layer, the recesses having a bottom surface of a roughness larger than a roughness of a surface of the cap layer under the gate electrode; a source electrode disposed on the bottom surface of the recess on the source side; and a drain electrode disposed on the bottom surface of the recess on the drain side.

5 Claims, 8 Drawing Sheets

U.S. PATENT DOCUMENTS

| | | | |
|---|---|---|---|
| 7,002,189 B2 * | 2/2006 | Kikkawa | 257/192 |
| 2004/0144991 A1 * | 7/2004 | Kikkawa | 257/103 |
| 2006/0054925 A1 * | 3/2006 | Kikkawa | 257/192 |

FOREIGN PATENT DOCUMENTS

| | | |
|---|---|---|
| JP | 2001-102565 | 4/2001 |
| JP | 2001-230407 | 8/2001 |
| JP | 2002-016087 | 1/2002 |
| JP | 2002-016312 | 1/2002 |
| JP | 2002-359256 | 12/2002 |

* cited by examiner

FIG.1A
FIG.1B
FIG.1C
FIG.1D
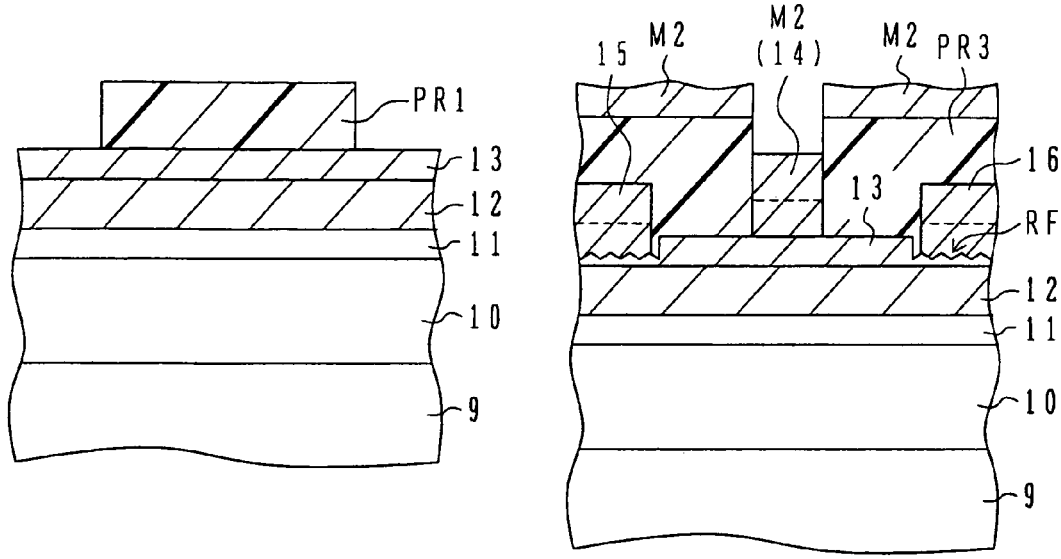
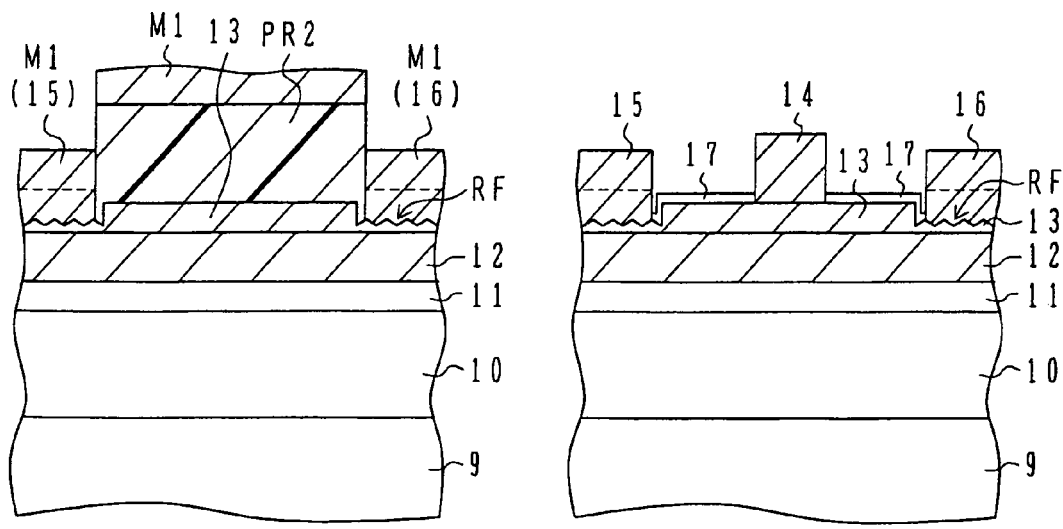

FIG.3

| | RELATED ART (FIG. 8C) | STOP DRY ETCHING AT GaN | |
| --- | --- | --- | --- |
| | | WITH LEAK CUT (FIG. 2B) | WITHOUT LEAK CUT (FIG. 1D) |
| CONTACT RESISTANCE | $1 \times 10^{-3} \sim 1 \times 10^{-4}\ \Omega cm^{-2}$ | $7 \times 10^{-6} \sim 3 \times 10^{-5}$ | $7 \times 10^{-6} \sim 3 \times 10^{-5}$ |
| ON-RESISTANCE | $12\ \Omega mm$ | $6 \sim 8$ | $6 \sim 8$ |
| TWO-TERMINAL REVERSE CURRENT @100V | $100\ \mu A/mm$ | $1$ | $50$ |
| gm | $140\ mS/mm$ | $220$ | $220$ |

FIG.5

| | RELATED ART (FIG. 8C) | STOP DRY ETCHING AT INTERFACE BETWEEN AlGaN AND GaN | |
|---|---|---|---|
| | | WITH LEAK CUT (FIG. 4B) | WITHOUT LEAK CUT (FIG. 4A) |
| CONTACT RESISTANCE | $1\times10^{-3} \sim 1\times10^{-4} \Omega \text{cm}^{-2}$ | $5\times10^{-6} \sim 1\times10^{-5}$ | $5\times10^{-6} \sim 1\times10^{-5}$ |
| ON-RESISTANCE | $12\Omega\text{mm}$ | $6\sim7$ | $6\sim7$ |
| TWO-TERMINAL REVERSE CURRENT @100 V | $100\mu\text{A/mm}$ | 1 | 50 |
| gm | $140\text{mS/mm}$ | 250 | 250 |

COMPOUND SEMICONDUCTOR DEVICE AND ITS MANUFACTURE

CROSS REFERENCE TO RELATED APPLICATION

This application is a divisional application of U.S. Ser. No. 10/764,486, filed Jan. 27, 2004 now U.S. Pat. No. 7,132,699, and is based on and claims priority of Japanese Patent Application No. 2003-17308 filed on Jan. 27, 2003, the entire contents of which are incorporated herein by reference.

BACKGROUND OF THE INVENTION

A) Field of the Invention

The present invention relates to a semiconductor device and its manufacture method, and more particularly to a compound semiconductor device having a channel (electron transfer) layer made of GaN group compound semiconductor and its manufacture method.

B) Description of the Related Art

GaN field effect transistors have been developed which use as a channel layer a GaN layer in contact with an AlGaN/GaN hetero junction. GaN has a wide band gap, a high breakdown electric field strength (intensity) and a high saturated electron velocity and is quite promising as the material of devices of high voltage operation and high output power.

A power device in a cellular phone base station is required to operate at a high voltage of 40 V or higher so that GaN field effect transistors present bright prospects. High voltage operation requires a high gate breakdown voltage (a high reverse gate voltage at a predetermined gate leak current, and a high gate-drain voltage at a predetermined gate-drain leak current).

FIGS. 8A and 8B are a cross sectional view and a graph showing the structure and characteristics of a conventional GaN field effect transistor (FET).

Referring to FIG. 8A, on a substrate made of sapphire or SiC, a buffer layer of GaN or AlN is formed when necessary, to form a work substrate 1. On this work substrate 1, a GaN channel (electron transfer) layer 2 is formed. An AlGaN electron supply layer 3 is formed on the GaN channel layer 2. The electron supply layer 3 has an n-type conductivity doped with, for example, Si and can supply electrons to the channel layer 2.

On the electron supply layer 3, a gate electrode 5, a source electrode 6 and a drain electrode 7 are formed, and the surface of the electron supply layer 3 is covered with a passivation film 4.

FIG. 8B shows the band structure of a semiconductor layer under the gate electrode of the semiconductor device shown in FIG. 8A. The abscissa represents a film thickness form the semiconductor surface in the unit of nm, and the ordinate represents the energy at the bottom of the conduction band in the unit of eV. It is known that GaN group semiconductor has large piezo polarization effects and large spontaneous polarization effects. These polarization effects raise the potential energy of the conduction band, from the interface between the GaN channel layer 2 and AlGaN electron supply layer 3 toward the surface of the AlGaN electron supply layer 3. In the GaN channel layer 2 at the interface with the AlGaN electron supply layer 3, two-dimensional electron gas (2DEG) is accumulated.

A tunneling current I through a potential barrier of length L has the following relation.

$$I \propto \exp(-C \times L)$$

The tunneling current increases as the potential barrier length L becomes short. As shown in FIG. 8B, there is a region where the potential energy of the conduction band in the AlGaN layer increases steeply and the potential barrier length becomes shorter. Through this region, electrons supplied from the surface (gate electrode) are likely to be tunneled. A two-terminal breakdown voltage is about several ten V which is insufficient for high voltage operation.

FIGS. 8C and 8D are a cross sectional view and a graph showing the structure and characteristics of an improved GaN-FET device.

As shown in FIG. 8C, as compared to the structure shown in FIG. 8A, an n-type GaN cap layer 8 is disposed between the electron supply layer 3 and gate electrode 5.

FIG. 8D shows the potential energy distribution of a conduction band bottom in the structure shown in FIG. 8C. The abscissa represents a film thickness from the substrate surface in the unit of nm and the ordinate represents the energy of the conduction band bottom in the unit of eV. Negative charges are accumulated at the interface between the n-type AlGaN electron supply layer 3 and n-type GaN cap layer 8 so that the potential energy increases from the surface of the n-type GaN cap layer 8 toward the AlGaN electron supply layer 3. Therefore, the peak potential energy of the conduction band at the interface between the n-type AlGaN electron supply layer 3 and n-type GaN cap layer 8 becomes high and the peak position moves from the substrate surface to a deeper position.

The band structure is changed in this manner so that a tunneling current from the substrate surface can be suppressed. It is possible to set a two-terminal gate breakdown voltage to 150 V or higher and a three-terminal gate breakdown voltage to 50 V or higher (for example, refer to Japanese Patent Laid-open Publication No. 2002-359256 which is incorporated herein by reference).

Japanese Patent Laid-open Publication No. 2001-230407 proposes a field effect transistor whose GaN cap layer under the source and drain electrodes is removed.

Japanese Patent Laid-open Publication No. 2002-16087 proposes a field effect transistor whose source and drain electrodes are formed on an AlGaN electron supply layer and a gate electrode is formed on an InGaN Schottky-contact-forming layer.

SUMMARY OF THE INVENTION

According to one aspect of the present invention, there is provided a compound semiconductor device comprising: a substrate; a channel layer disposed above the substrate and consisting essentially of GaN; an electron supply layer disposed above the channel layer and consisting essentially of n-type $Al_qGa_{1-q}N$ ($0<q\leq1$); a cap layer disposed above the electron supply layer and consisting essentially of n-type GaN; a gate electrode disposed on the cap layer and forming a Schottky contact; recesses formed on both sides of the gate electrode on source and drain sides by removing at least part of the cap layer, the recess having a bottom surface of a roughness larger than a roughness of a surface of the cap layer under the gate electrode; a source electrode disposed on the bottom surface of recess on the source side; and a drain electrode disposed on the bottom surface of the recess on the drain side.

According to another aspect of the present invention, there is provided a method of manufacturing a compound semiconductor device comprising the steps of: (a) epitaxially laminating, above a substrate, a channel layer consisting essentially of GaN, an electron supply layer consisting essentially of n-type $A_qGa_{1-q}N(0<q\leq1)$ and a cap layer consisting essentially of n-type GaN, in this order recited; (b) forming a gate electrode on the cap layer, the gate electrode having a Schottky contact; (c) etching at least part of the cap layer to form recesses on both sides of the gate electrode on source and drain sides, in such a manner that a bottom surfaces of the recesses have a roughness larger than a roughness of a surface of the cap layer under the gate electrode; and (d) forming a source electrode and a drain electrode on the bottom surfaces of the recesses on the source and drain sides.

The source and drain resistances can be lowered by forming the recesses under the source and drain electrodes by removing at least part of the cap layer. The contact resistance can be lowered by providing the bottom surface of the recess with roughness.

By forming a notch in the cap layer between the gate electrode and drain electrode, leak current between the gate and drain can be reduced.

As above, it is possible to improve the breakdown voltage relative to the gate electrode and suppress an increase in contact resistance of source and drain electrodes.

BRIEF DESCRIPTION OF THE DRAWINGS

FIGS. 1A to 1D are cross sectional views showing a semiconductor device and its manufacture method according to a first embodiment of the invention.

FIG. 3 is a table showing the comparison of characteristics between samples according to the first embodiment and related art.

FIG. 5 is a table showing the comparison of characteristics between samples according to the second embodiment shown in FIGS. 4A and 4B and related art.

DESCRIPTION OF THE PREFERRED
EMBODIMENTS

Figure 8A:
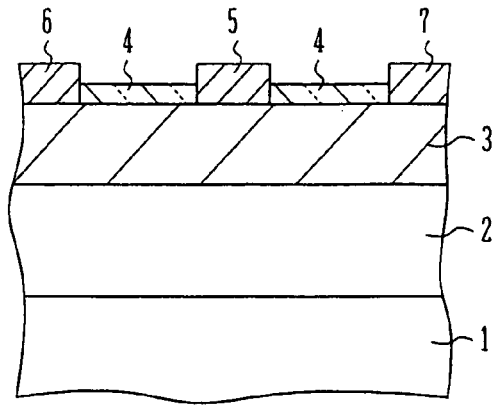
FIGS. 8A to 8D are cross sectional views and graphs showing the structures of prior art and related semiconductor devices and their band structures.
Figure 8B:
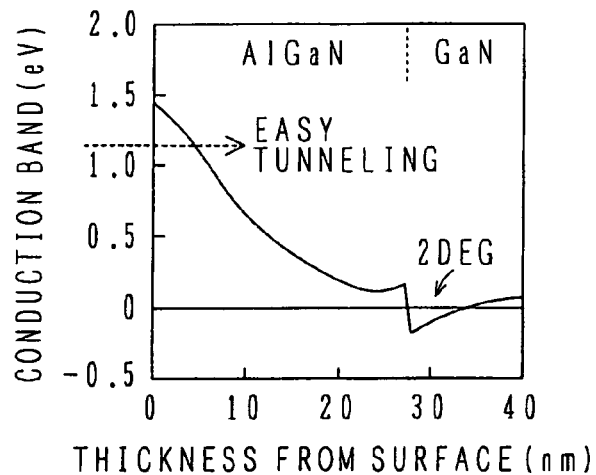
Figure 8C:
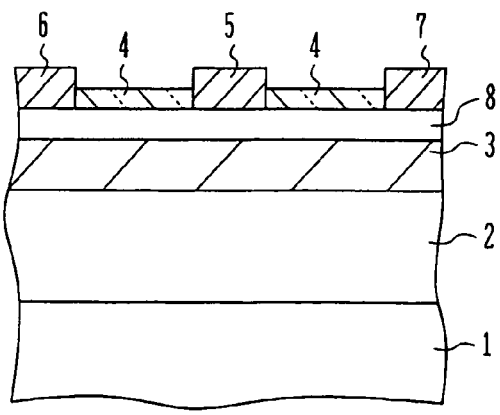
Figure 8D:
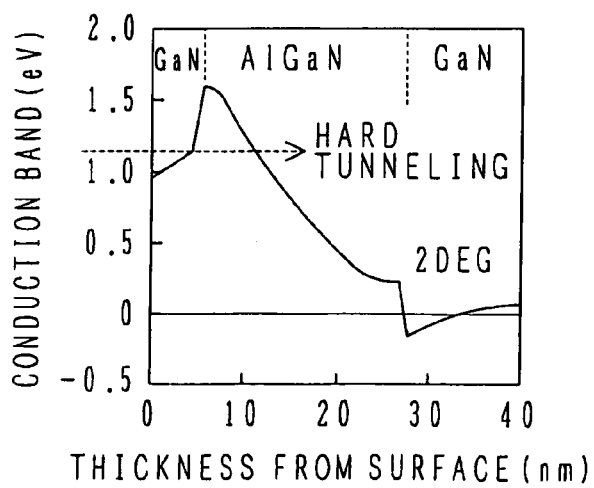

In the GaN-FET structure shown in FIG. 8C, the n-type cap layer 8 is deposited not only under the gate electrode but also under the source electrode 6 and drain electrode 7. Since the electron tunneling effects are suppressed, the contact resistances of the source electrode 6 and drain electrode 7 are increased by about two digits, to $10^{-3}$ to $10^{-4}$ $\Omega cm^2$, as compared to a conventional device. The source series resistance is also increased so that the mutual conductance lowers.

A two-terminal reverse leak current between the gate and drain measured was 100 μA/mm.

It is desired to have a high breakdown voltage relative to the gate electrode and lower the contact resistances of the source and drain electrodes. It is also desired to reduce a two-terminal reverse leak current between the gate and drain.

An object of the embodiment of this invention is to provide a compound semiconductor device and its manufacture method, capable of improving a gate breakdown voltage and suppressing an increase in contact resistances of source and drain electrodes and an increase in reverse leak current between the gate and drain.

Another object of the embodiment of this invention is to provide a compound semiconductor device and its manufacture method, capable of realizing a high breakdown voltage of a gate electrode and suppressing an increase in contact resistances of source and drain electrodes, an increase in source series resistance, an increase in leak current between the gate and drain and an increase in leak current between the gate and source.

Still another object of the embodiment of the invention is to provide a GaN type field effect transistor having improved characteristics.

Embodiments of the invention will be described with reference to the accompanying drawings.

FIGS. 1A to 1D are cross sectional views showing a semiconductor device and its manufacture method according to the first embodiment. As shown in FIG. 1A, on the surface of an SiC substrate 9, an undoped GaN channel (electron transfer) layer 10 is deposited to a thickness of about 3 ?m by metal organic vapor phase deposition (MOVPE). In place of the SiC substrate, a sapphire substrate may be used. The channel layer may be grown after a buffer layer is formed on the substrate.

On the channel layer 10, an undoped Al0.25Ga0.75N spacer layer 11 is deposited to a thickness of about 3 nm by MOVPE, next an n-type $Al_{0.25}Ga_{0.75}N$ electron supply layer 12 doped with Si at a concentration of $1\times10^{17}$ cm$^{-3}$ or more is grown to a thickness of about 20 nm, and then an n-type GaN cap layer 13 doped with Si at a concentration of $1\times10^{17}$cm$^{-3}$ or more, e.g., at $2\times10^{18}$ cm$^{-3}$ is deposited to a thickness of 10 nm or thinner, e.g., 5 nm, respectively by MOVPE. In this manner, a semiconductor lamination structure is formed by MOVPE. The surface of the n-type GaN cap layer 13 has a roughness of about 0.3 nm.

Since the n-type GaN cap layer 13 having large piezo polarization and spontaneous polarization effects is formed on the n-type $Al_{0.25}Ga_{0.75}N$ electron supply layer 12, it is possible to raise the potential barrier of the semiconductor lamination structure and enlarge the size thereof in the thickness direction. The breakdown voltage relative to the gate electrode can be increased. However, this high gate breakdown voltage is inevitably followed by high source and drain resistances, with source and drain electrodes being formed on the n-type GaN cap layer 13.

Electron affinity of GaN is larger than that of AlGaN. In the case of GaN and AlGaN, the compound semiconductor having a larger electron affinity has a smaller band gap. When surfaces having different electron affinities are made in contact, electrons are likely to be accumulated in the substance having a larger electron affinity.

A resist layer is coated on the surface of the semiconductor lamination structure, exposed and developed to form a photoresist pattern PR1. The photoresist pattern PR1 has openings in the regions corresponding to the regions where the source and drain electrodes are to be formed. The cap layer 13 exposed in the openings are partially removed by dry etching using mixture gas of chlorine containing gas such as $Cl_2$ and inert gas. It is preferable to set the thickness of the left GaN cap layer to 2 nm or thinner. The photoresist pattern PR1 is thereafter removed.

As the GaN cap layer is thinned, the piezo polarization and spontaneous polarization effects of GaN are mitigated to lower the potential barrier and shorten the barrier length. If source/drain electrodes are formed on the thinned GaN layer, tunneling current becomes easy to flow so that the source/drain resistances can be lowered effectively.

If the interface between AlGaN/GaN is steep, the piezo effects and the like are likely to occur, whereas if the interface is gentle, the piezo effects are greatly suppressed. In the latter case, a rise in the band is eliminated and ohmic contact becomes easy to be established.

The roughness of the GaN surface of the recess portion formed through dry etching is controlled to be larger than the roughness of the GaN surface in the gate electrode forming region covered with the photoresist pattern PR1. The etching conditions are set so that the roughness of the GaN surface in the source/drain forming regions becomes at least 1.5 times as large as that in the gate electrode forming region.

More specifically, the roughness can be increased by raising a bias voltage and a pressure (a bias voltage is raised to 100 V or higher although it is usually 50 V or lower, and a pressure is raised to about 4 Pa although it is usually about 2 Pa). By adopting such etching conditions not used by general selective etching, the roughness can be increased.

For example, the roughness of the GaN surface in the source/drain electrode forming regions is set to a range of 1.5 times to 10 times as large as that of the GaN surface in the gate electrode forming region. With such a surface roughness, the contact area of an electrode formed on the rough surface is increased so that the contact resistance can be lowered.

If the roughness becomes large, nitrogen (N) atoms near in the surface layer are allowed to escape to the extension so that N vacancies are formed. These N vacancies function as an n-type donor so that a high concentration n-type layer is formed on the GaN surface.

As shown in FIG. 1B, a new photoresist pattern PR2 is formed covering the terrace (non-etched) portion of the GaN cap layer and the stepping-down edge portions extending to the adjacent recess (etched) portions. A metal layer M1 is then deposited, the metal layer M1 being a lamination of a Ti layer and an Al layer. The metal layer M1 is deposited on the resist pattern PR2 is lift off together with the resist pattern PR2. A source electrode 15 and a drain electrode 16 are left on the surfaces of the recess portions of the semiconductor lamination structure.

The source electrode 15 and drain electrode 16 are formed spaced apart from the terrace portion of the dap layer 13. In other words, the cap layer 13 on which a gate electrode is to be formed has steps in front of the source electrode 15 and drain electrode 16. The source/drain electrodes are not in contact with the upper surface of the GaN layer. It is not necessary to dispose the source/drain electrodes too far away from the steps of the terrace portions. This layout is important in terms of leak current reduction to be later described.

The source electrode 15 and drain electrode 16 are subjected to annealing at 450° C. to 900° C.

Reaction allowed during annealing is likely to be enhanced because of the enlarged contact area between the cap layer 13 and electrodes 15, 16 formed by the large roughness.

In the above manner, ohmic contact of the source/drain electrodes is formed on the semiconductor lamination structure.

As shown in FIG. 1C, a new photoresist pattern PR3 is formed having a gate electrode opening within the gate electrode forming region. The gate electrode opening is formed narrower than the terrace width of the cap layer 13. For example, the gate length of the gate electrode is set to about 1 µm.

A metal layer M2 is deposited by stacking an Ni layer and an Au layer. The metal layer M2 deposited on the photoresist pattern PR3 is lifted off together with the photoresist pattern PR3. In this manner, the gate electrode 14 is formed on the cap layer 13.

As shown in FIG. 1D, an SiN layer 17 is deposited by CVD to a thickness of, for example, 20 nm, and the unnecessary SiN layer on the surfaces of the electrodes is removed to expose the electrodes to thus complete a semiconductor device.

In the structure shown in FIG. 1D, since the n-type GaN cap layer 13 is disposed between the gate electrode 14 and electron supply layer 12, the peak of the potential energy in the semiconductor lamination structure can be made high, the barrier can be broadened (the potential barrier peak is shifted away from the surface), the tunneling current can be reduced and the gate breakdown voltage can be raised.

Since the n-type GaN cap layer 13 is thinned under the source electrode 15 and drain electrode 16, the peak of the potential energy is lowered and the barrier length is shortened. The contact resistance of the source electrode 15 and drain electrode 16 can therefore be lowered. Since the source resistance associated with the source electrode 15 is lowered, the mutual conductance can be improved.

The passivation film 17 formed on the surface of the n-type GaN cap layer 13 can expel holes induced near at the interface between the cap layer 13 and the passivation film 17 back into the inside. It is therefore possible to lower the potential peak energy of the conduction band at the interface between the n-type AlGaN electron supply layer and n-type GaN cap layer to be lower than that otherwise raised by a piezo electric field in the cap layer. An increase in leak current can be suppressed because there are gaps between the recessed bottom surfaces of the n-type GaN cap layer 13 with the source electrode 15 and drain electrode 16 formed thereon and the terrace portion surface of the n-type GaN cap layer 13 with the gate electrode 14 formed thereon.

A sufficiently high gate breakdown voltage can be obtained by the structure shown in FIG. 1D. However, the leak current between the gate and drain cannot be said at a sufficiently low level.

Figure 2A:
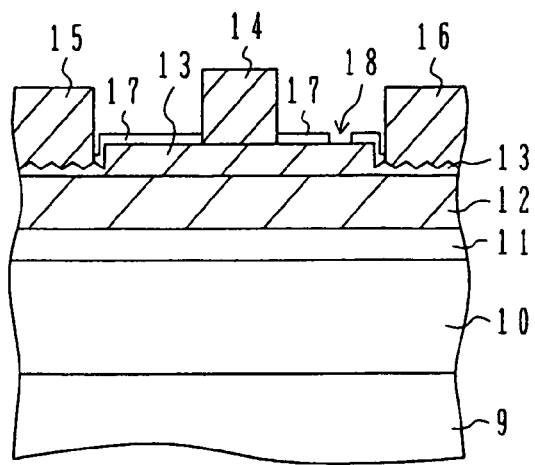
FIGS. 2A, 2B and 2C are cross sectional views showing modifications of the embodiment shown in FIGS. 1A to 1D.
Figure 2B:
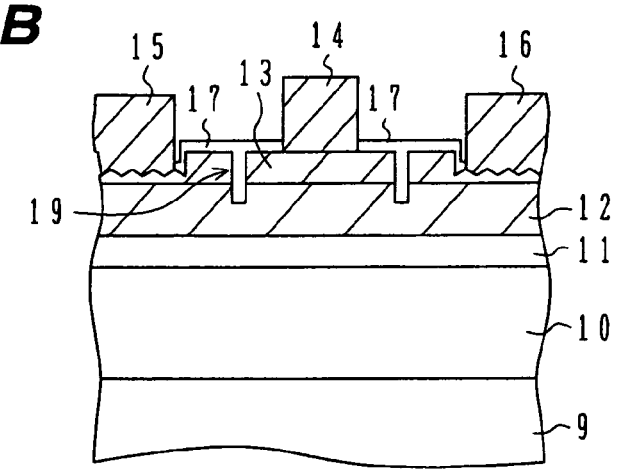
Figure 2C:
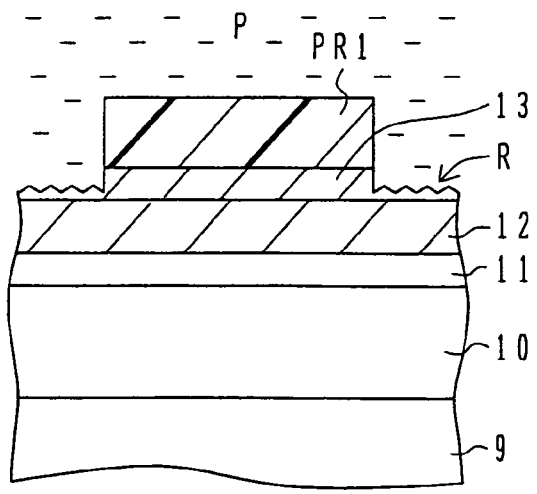

FIGS. 2A to 2C show a modification of the first embodiment shown in FIGS. 1A to 1D.

As shown in FIG. 2A, a notch 18 was formed in a passivation layer 17 between the gate electrode 14 and drain electrode 16 to cut the passivation layer 17 at a position between the two electrodes. The involvement of the notch 18 reduced the leak current.

This phenomenon may be ascribed to that leak current increases if the interface between the n-type GaN cap layer 13 and passivation layer 17 forms a continuous plane and the leak current reduces if the interface is cut at any position or is stepped down or above.

FIG. 2B shows another structure for reducing the leak current. A notch 19 was formed at least in the cap layer 13 in the areas between the gate electrode 14 and the source electrode 15 and between the gate electrode and the drain electrode 16, extending from the surface of the n-type GaN cap layer 13, traversing the GaN cap layer in a depth direction and reaching the inside of the AlGaN electron supply layer 12, and thereafter a passivation layer 17 was formed. Leak current can be expected to be reduced by the interface between the passivation layer 17 and n-type GaN cap layer 13 which interface has steps between the adjacent electrodes and changes its direction abruptly.

The roughness of the surfaces of the GaN layer under the source and drain electrodes is not limited only to those being formed by etching.

FIG. 2C illustrates a process of exposing the recessed surfaces of a GaN cap layer in the source/drain forming regions to plasma P, to make the surfaces rough and increase the roughness. Exposure to the plasma P increases the surface roughness R.

FIG. 3 is a table showing the measured characteristics of samples having the structures shown in FIGS. 1D and 2B. The characteristics of samples having the related art structure shown in FIG. 8C were also measured for the purpose of comparison.

A contact resistance was $1 \times 10^{-3}$ to $1 \times 10^{-4}$ $\Omega \mathrm{cm}^{-2}$ for the structure according to the related art. In contrast, the contact resistances of the structures shown in FIGS. 1D and 2B were $7 \times 10^{-6}$ to $3 \times 10^{-5}$ $\Omega \mathrm{cm}^{-2}$, improved by more than one digit, approximately by two digits.

An on-resistance was about 12 $\Omega$mm for the structure shown in FIG. 8C according to the related art. In contract, the on-resistance was approximately halved to 6 to 8 $\Omega$mm for the structures shown in FIGS. 1D and 2B.

A two-terminal reverse current between gate and drain was 100 μA/mm at 100 V for the structure shown in FIG. 8C according to related art. In contrast, the two-terminal reverse current was halved to 50 μA/mm for the structure shown in FIG. 1D, and for the structure shown in FIG. 2B, reduced to 1 μA/mm, about ¹⁄₁₀₀ times as that of the related art structure.

A mutual conductance gm was 140 mS/mm for the structure shown in FIG. 8C according to related art. In contrast, the mutual conductance was increased considerably to 220 mS/mm for the structures shown in FIGS. 1D and 2B. The characteristics can be improved greatly by the first embodiment and its modification, as compared to the related art characteristics.

In the embodiment shown in FIGS. 1A to 1D, the n-type GaN cap layer under the source and drain electrodes is partially removed. The n-type GaN layer may be removed completely.

Figure 4A:
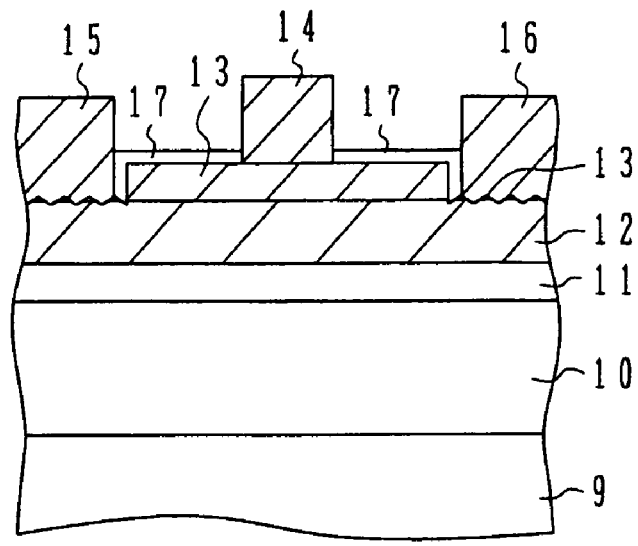
FIGS. 4A and 4B are cross sectional views of a semiconductor device according to a second embodiment of the invention and a modification thereof.
Figure 4B:
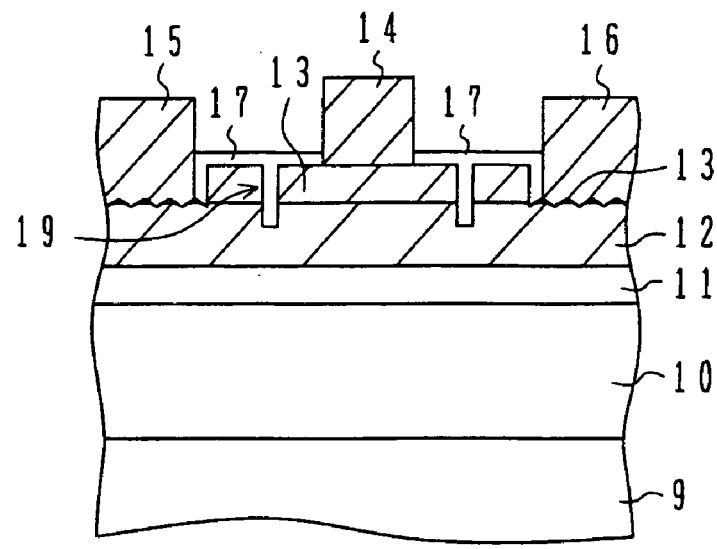

FIGS. 4A and 4B are cross sectional views showing a semiconductor device and its manufacture method according to another embodiment of the invention and a modification thereof.

As shown in FIG. 4A, in the etching process shown in FIG. 1A, the n-type GaN cap layer 13 is etched by almost the whole thickness thereof. In this case, roughness on the etched surface leaves a partial n-type GaN cap layer 13 in the less-etched area, and in the remaining surface area, partially etches the AlGaN electron supply layer 12.

As a source electrode 15 and a drain electrode 16 are deposited, these electrodes contact the n-type GaN cap layer 13 in a partial area and the n-type AlGaN layer 12 in the other area. The resistance increasing effects of the n-type GaN layer 13 can be minimized and the exposed area of the AlGaN layer 12 containing Al can be made small so that the surface oxidation can be prevented effectively. In addition, since the electrode contact area is increased by the surface roughness, the contact resistance can be lowered. The surface roughness provides the surface n-type impurity concentration increasing effects and the annealing reaction enhancing effects.

FIG. 4B shows the structure shown in FIG. 4A modified in such a manner that notches 19 are formed extending from the surface of the n-type GaN cap layer 13, traversing the cap layer 13, to the inside of the AlGaN electron supply layer 12.

FIG. 5 is a table showing the measured characteristics of samples having the structures shown in FIGS. 4A and 4B. The characteristics of samples having the related art structure shown in FIG. 8C were also measured for the purpose of comparison.

A contact resistance was $5 \times 10^{-6}$ to $1 \times 10^{-5}$ $\Omega \mathrm{cm}^{-2}$ for both the structures shown in FIGS. 4A and 4B, being improved considerably as compared to related art, being improved more than that of the structures shown in FIGS. 1D and 2B. An on-resistance was approximately halved to 6 to 7 ?mm as compared to the related art, being stabilized further than that of the structures shown in FIGS. 1D and 2B.

A two-terminal reverse current between gate and drain was 50 μA/mm for the structure shown in FIG. 4A similar to that of the structure shown in FIG. 1D. The two-terminal reverse current was 1 μA/mm for the structure shown in FIG. 4B similar to that of the structure shown in FIG. 2B.

A mutual conductance gm was 250 mS/mm for both the structures shown in FIGS. 4A and 4B, being considerably improved as compared to related art and also to the structures shown in FIGS. 1D and 2B.

The depth of each recess portion under the source or drain electrode is not limited only to the intermediate position in the n-type GaN cap layer 13 or to the interface between the n-type GaN cap layer 13 and underlying n-type AlGaN layer 12.

Figure 6A:
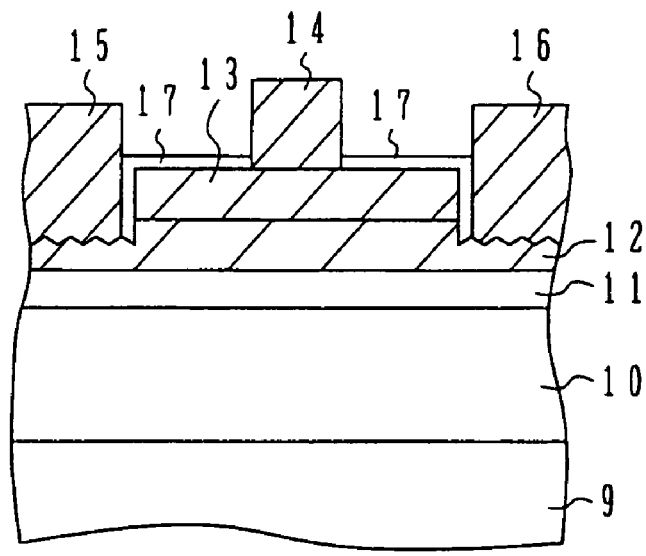
FIGS. 6A and 6B are cross sectional views showing the structures of a semiconductor device according to a further embodiment of the invention and a modification thereof.

FIG. 6A shows the structure that the recess portions partially enter the inside of the n-type AlGaN layer 12. After the n-type GaN cap layer 13 is removed in the etching process shown in FIG. 1A, the etching continues until the n-type AlGaN layer 12 is partially etched. This etching amount is set to, for example, 10 nm or thinner in the depth direction. The other processes are similar to those described with reference to FIGS. 1A to 1D.

Figure 6B:
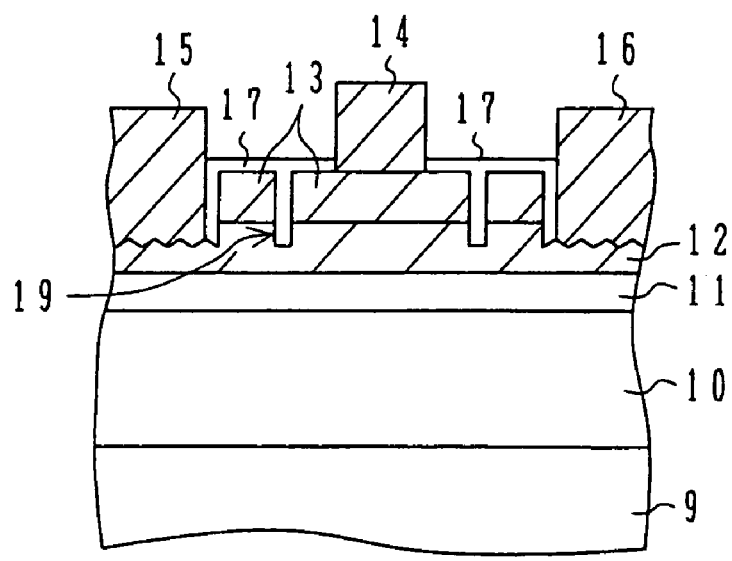

FIG. 6B shows the structure shown in FIG. 6A modified in such a manner that notches 19 are formed extending from the surface of the n-type GaN cap layer 13 to the inside of the AlGaN electron supply layer 12. With this structure, leak current can be expected to be reduced more than that of the structure shown in FIG. 6A.

Figure 7A:
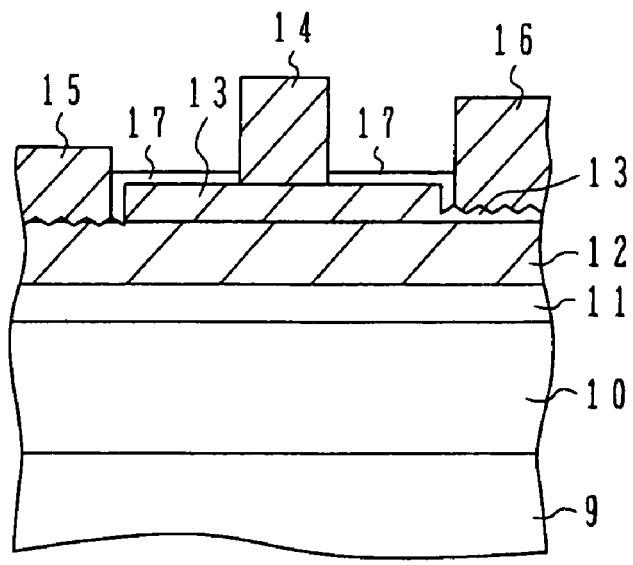
FIGS. 7A and 7B are cross sectional views showing the structure of a semiconductor device according to a still further embodiment of the invention and a modification thereof.

FIG. 7A shows the structure that the depth of the recess portion under the source electrode is made different from that under the drain electrode. The recess portion under the drain electrode 16 reaches an intermediate depth of the n-type GaN cap layer 13, whereas the recess portion under the source electrode 15 reaches the interface between the n-type GaN cap layer 13 and n-type AlGaN electron supply layer 12 similar to the structure shown in FIG. 4A. The contact resistance of the source electrode 15 as well as the source resistance can be expected to be lowered more.

Figure 7B:
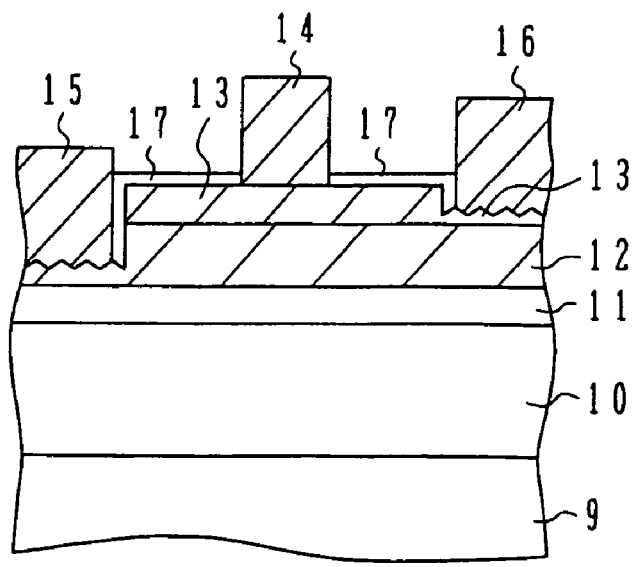

FIG. 7B shows the structure that the recess portion under the source electrode 15 is made deeper. The recess portion under the source electrode 15 is made deeper by partially removing the n-type AlGaN electron supply layer 12. It can be expected that both the source contact resistance and the source resistance can be lowered more.

Etching using different resist masks can be performed to form recess portions under the source electrode 15 and drain electrode 16 having different depths as shown in FIGS. 7A and 7B.

The present invention has been described in connection with the preferred embodiments. The invention is not limited only to the above embodiments. For example, although GaN and AlGaN are used in the embodiments, similar advantageous effects can be expected even by using $In_xGa_{1-x}N$ ($0 \leq x < 1$) and $In_pAl_qGa_{1-p-q}N$ ($0 \leq p < 1$, $0 \leq q < 1$, $0 < p+q \leq 1$) which contain In and having a critical film thickness or thinner. It will be apparent to those skilled in the art that other various modifications, improvements, combinations, and the like can be made.

What we claim are:

1. A method of manufacturing a compound semiconductor device comprising the steps of:

(a) epitaxially laminating above a substrate a channel layer consisting essentially of GaN, an electron supply layer consisting essentially of n-type AlqGa1-qN (0<q (1) and a cap layer consisting essentially of n-type GaN, in this order recited;
(b) forming a gate electrode on said cap layer, said gate electrode having a Schottky contact;
(c) etching at least part of the cap layer to form recesses on both sides of said gate electrode on source and drain sides, in such a manner that a bottom surfaces of said recesses have a roughness larger than a roughness of a surface of said cap layer under said gate electrode; and
(d) forming a source electrode and a drain electrode on the bottom surfaces of said recesses on the source and drain sides.

2. The method of manufacturing a compound semiconductor device according to claim 1, wherein said step (c) partially leaves said cap layer and partially exposes said electron supply layer by positively utilizing said roughness, and said step (d) forms one or both of said source and drain electrodes so as to make one or both contact both said cap layer and said electron supply layer.

3. The method of manufacturing a compound semiconductor device according to claim 1, further comprising a step of exposing the surfaces of said recesses to plasma after said step (c).

4. The method of manufacturing a compound semiconductor device according to claim 1, wherein said step (c) includes etching said recess on the source side by using a mask and etching said recess on the drain side by using another mask.

5. The method of manufacturing a compound semiconductor device according to claim 1, further comprising a step of forming a notch through said cap layer, said notch traversing in a depth direction said cap layer at least between said gate electrode and said drain electrode or between said source electrode and said gate electrode.

* * * * *